United States Patent [19]

Cunningham

[11] Patent Number: 5,801,397
[45] Date of Patent: Sep. 1, 1998

[54] DEVICE HAVING A SELF-ALIGNED GATE ELECTRODE WRAPPED AROUND THE CHANNEL

[75] Inventor: James A. Cunningham, Saratoga, Calif.

[73] Assignee: SGS-Thomson Microelectronics, Inc., Carrollton, Tex.

[21] Appl. No.: 452,893

[22] Filed: May 30, 1995

Related U.S. Application Data

[62] Division of Ser. No. 315,955, Sep. 30, 1994.
[51] Int. Cl.⁶ .................. H01L 29/76; H01L 31/036; H01L 27/01; H01L 27/12
[52] U.S. Cl. .................. 257/66; 257/67; 257/347; 257/349; 257/302; 257/401; 257/329
[58] Field of Search .................. 257/66, 67, 347, 257/349, 302, 329, 401

[56] References Cited

U.S. PATENT DOCUMENTS

| | | | |
|---|---|---|---|
| 4,980,308 | 12/1990 | Hayashi et al. | 437/40 TFT |
| 5,120,666 | 6/1992 | Gotou | 437/40 |
| 5,135,888 | 8/1992 | Chan et al. | 437/186 |
| 5,187,114 | 2/1993 | Chan et al. | 437/52 |
| 5,204,279 | 4/1993 | Chan et al. | 437/47 |
| 5,308,998 | 5/1994 | Yamazaki et al. | 257/66 |
| 5,323,042 | 6/1994 | Matsumoto | 257/72 |
| 5,372,959 | 12/1994 | Chan | 437/41 TFT |
| 5,395,772 | 3/1995 | Miyazawa et al. | 257/347 |
| 5,401,665 | 3/1995 | Chan | 437/40 TFT |
| 5,414,288 | 5/1995 | Fitch et al. | 257/329 |
| 5,482,871 | 1/1996 | Pollack | 257/66 |
| 5,482,877 | 1/1996 | Rhee | 437/40 TFT |

FOREIGN PATENT DOCUMENTS

| | | |
|---|---|---|
| 0 418 983 A1 | 3/1991 | European Pat. Off. |
| 0 487 220 A2 | 5/1992 | European Pat. Off. |
| 0 612 103 A2 | 8/1994 | European Pat. Off. |
| 62-274662 | 11/1987 | Japan ................. 257/401 |
| 2-27772 | 1/1990 | Japan ................. 257/66 |
| 3-114233 | 5/1991 | Japan ................. 257/329 |
| 4-318972 | 11/1992 | Japan ................. 257/67 |
| 5-29573 | 2/1993 | Japan ................. 257/302 |

OTHER PUBLICATIONS

Simoen et al., "A Low-Frequency Noise Study of Gate-All-Around SOI Tranistors," *IEEE Transactions on Electron Devices*, vol. 40, No. 11, Nov. 1993, pp. 2054–2059.

Colinge et al., "Silicon-on-Insulator Gate-All-Around Device," *IEDM*, p. 595, (1990).

Fa and Jew, "The Poly-Silicon Insulated-Gate Field-Effect Transistor," *IEEE Transactions on Electron Devices* 13(12), p. 290 (1966).

Goto et al., "A 3.3V 12 ns 16 Mb CMOS SRAM," [NEC], *ISSCC*, p. 216 (1992).

Inoue et al., "Low Temperature CMOS Self-Aligned Poly-Si TFTs and Circuit Scheme Utilizing New Ion Doping and Masking Technique," *IEEE, IEDM*, p. 20.1.1 (1991).

Ishibashi et al., "A 1V TFT-Load SRAM Using a Two-Step Word-Voltage Method," *IEEE ISSCC*, p. 206, (1992).

Lewis et al., "Small Geometry Effects in N-and P-Channel Polysilicon Thin Film Transistors," *IEDM IEEE*, p. 260 (1988).

(List continued on next page.)

*Primary Examiner*—Carl W. Whitehead, Jr.
*Attorney, Agent, or Firm*—David V. Carlson; Theodore E. Galanthay; Lisa K. Jorgenson

[57] ABSTRACT

A semiconductor device includes an insulating support. A strip of semiconductor material has two ends in contact with the insulating support and a midsection extending between the ends. A dielectric layer encircles the midsection, and a conductive layer encircles the dielectric layer. The conductive layer has a substantially constant width such that a gate electrode formed within the conductive layer is fully self-aligned with drain and source regions formed within the ends.

18 Claims, 4 Drawing Sheets

OTHER PUBLICATIONS

Lewis et al., "Physical Mechanisms for Short Channel Effects in Polysilicon Thin Film Transistors," *IEDM, IEEE*, p. 13.4.1 (1989).

Liu et al., High Reliability and High Performance 0.35 µm Gate-Inverted TFT's for 16 Mbit SRAM Application Using Self-Aligned LDD Structures, [AT&T], *IEEE IEDM*, p. 823 (1992).

Liu et al., "Inverted Thin-Film Transistors with a Simple Self-Aligned Lightly Doped Drain Structure," *IEEE Transactions on Electron Devices* 39(12), p. 2803 (1992).

Mimura et al., "High-Performance Low-Temperature Poly-Si TFTs for LCD," *IEDM, IEEE*, p. 18.1 (1987).

Murakami et al., "A 21 mW CMOS SRAM for Battery Operation," [Mitsubishi Electric], *ISSCC*, p. 46 (1991).

Nakamura et al., "A High-Reliability, Low-Operation-Voltage Monolithic Active-Matrix LCD by Using Advanced Solid-Phase-Growth Technique," *IEEE, IEDM*, p. 34.2.1 (1990).

Ono et al., "Polysilicon TFTs with Low Gate Line Resistance and Low Off-State Current Suitable for Large Area and High Resolution LCDs," *IEEE*, p. 13.3.1 (1989).

Sasaki et al., "A 7ns 140 mW CMOS SRAM with Current Sense Amplifier," [Hitachi], *ISSCC*, p. 208 (1992).

Uttecht and Geffken, "A Four-Level-Metal Fully Planarized Interconnect Technology for Dense High Performance Logic and SRAM Applications," *VMIC*, p. 20 (1991).

Hayden et al., "A High-Performance Quadruple Well, Quadruple Poly BiCMOS Process for Fast 16Mb SRAMs," *IEEE IEDM*, p. 819 (1992).

DEVICE HAVING A SELF-ALIGNED GATE ELECTRODE WRAPPED AROUND THE CHANNEL

This is a Division, of application Ser. No. 08/315,955, filed Sept. 30, 1994 pending.

TECHNICAL FIELD

The present invention relates generally to semiconductor devices and more particularly to a thin-film transistor (TFT).

BACKGROUND OF THE INVENTION

The concept of placing the conducting channel of an MOS transistor within a thin film of polycrystalline silicon (poly) is quite old dating back to the late 1960s. But despite a significant research and development effort, these devices and their amorphous silicon counterparts enjoyed little commercial success until recent years. This is because, compared to MOS transistors prepared on single crystal substrates, thin film transistors (TFTs) using poly or amorphous materials typically exhibit much lower transconductance due to the lower carrier mobility. They were also often characterized by high and unreproducible threshold voltages due to charging effects arising from traps believed to reside at the grain boundaries.

In the early 1980s, TFTs prepared with hydrogenated amorphous silicon (α-Si:H) were studied for thin-film image sensor applications. Recrystallization of this or similar material led to relatively high performance poly TFTs. By the late 1980s poly TFTs were applied in production quantities to active-matrix-type liquid crystal displays (LCDs). These products use glass or quartz substrates. The TFTs are relatively large in size compared to conventional MOS transistors and operate at higher voltages than those commonly used in digital applications.

TFTs have not been applied to standard CMOS devices in large production quantities as yet although many papers have been published in recent years on this general topic. Koichiro Ishibashi et al., "A 1V TFT-Load SRAM Using a Two-Step Word-Voltage Method, IEEE ISSCC, pg. 206 (1992); Sjuji Murakami et al., "A 21 mW CMOS SRAM for Battery Operation," [Mitsubishi Electric], ISSCC, pg. 46 (1991); Katsuro Sasaki et al., A 7 ns 140 mW CMOS SRAM with Current Sense Amplifier," [Hitachi], ISSCC, pg. 208 (1992); Hiroyuki Goto et al., "A 3.3 V 12 ns 16 Mb CMOS SRAM," [NEC], ISSCC, pg. 216 (1992); C.T. Liu et al., "High Reliability and High Performance 0.35 µm Gate-Inverted TFT's for 16 Mbit SRAM Application Using Self-Aligned LDD Structures, [AT&T], IEEE IEDM, pg. 823 (1992); J. P. Colinge et al., "Silicon-on-Insulator Gate-All-Around Device," IEDM, pg. 595 (1990); J. D. Hayden et al., "A High-Performance Quadruple Well, Quadruple Poly BiCMOS Process for Fast 16 Mb SRAMs," IEEE IEDM, pg. 819 (1992) reported in 1992 an experimental SRAM cell, see Koichiro Ishibashi et al., "A 1 V TFT-Load SRAM Using a Two-Step Word-Voltage Method, IEEE ISSCC, pg. 206 (1992).

TFTs, although often larger than their single-crystal counterparts, are often used to produce integrated circuits having reduced areas. For example, a TFT may be used as a load device in a static random access memory (SRAM) cell. Typically, a TFT is a field-effect transistor (FET) having its channel, drain, and source regions formed from a strip of semiconductor material that has been formed on a dielectric substrate, such as quartz or glass. Thus, unlike a conventional FET that is formed in a semiconductor substrate, a TFT may be formed in vertical alignment with a semiconductor structure, such as an SRAM cell. Such stacking of integrated-circuit components often provides a significant reduction in the area of the integrated circuit.

However, TFTs often exhibit significantly lower "on" currents, $I_{dsat}$, than do their conventional counterparts with similar W/L ratios. Additionally, the switching speed of a TFT is often too slow for certain applications.

SUMMARY OF THE INVENTION

A method is disclosed for building poly TFTs with self-aligned gate electrodes which completely encircle the channel region. This encirclement increases the width dimension by a factor of two at a minimum. The increased "on" current flow is greater than this because the conduction is not only along two inverted channels, but through volume inversion as well. Volume inversion effects have been reported for dual-gate devices, that is, MOS transistors with upper and lower gate electrodes. See E. Simoen et al., "A Low-Frequency Noise Study of Gate-All-Around SOI Transistors," IEEE Tran. on Electron Dev. 40(11): 2054 (1993).

The inventive process involves forming a cavity below a poly film patterned into narrow strips. The poly layer is used to form the channel, and source and drain regions of the TFT. The cavity and a channel or slot are provided into the dielectric substrate using standard photoresist methods and etching techniques. A second film of highly conformal LPCVD poly is then let into the cavity and channel somewhat analogous to the "damascene" process, used for metal layers and reported in recent years by IBM. See, R. R. Uttecht and Robert M. Geffken, "A Four-Level-Metal Fully Planarized Interconnect Technology For Dense High Performance Logic and SRAM Applications," VMIC, pg. 20 (1991). The second poly film forms a self-aligned gate electrode around the transistor channel region in the thin first poly film. Functional n- or p-channel transistors are created using only two photomasking steps. The minimum transistor length is 4λ, where λ is the minimum feature size. This compares to standard MOS technology, which provides minimum poly line widths (transistor lengths as viewed from the surface of the wafer) of 2λ.

It is a basic object of the invention to provide a process for improving the on current and performance of poly TFTs such that these devices may be used more broadly in various applications of integrated circuits.

In accordance with the present invention, a semiconductor device, which includes an insulating support, is provided. A strip of semiconductor material has a pair of opposing ends in contact with the insulating support and a midsection extending between the ends. A layer of dielectric material encircles the midsection, and a layer of conductive material encircles the dielectric layer.

In one aspect of the invention, the semiconductor device is a TFT formed on a dielectric substrate. The opposing ends form the source and drain regions respectively, and the midsection forms the channel region. The dielectric layer and the conductive layer form the gate insulator and the gate electrode respectively. In another aspect of the invention, the source and drain regions respectively include lightly doped source and drain regions.

An advantage provided by one aspect of the present invention is an increase in "on" current without an increase in either $V_{ds}$ or $V_{gs}$.

An advantage provided by another aspect of the present invention is an increase in switching speed.

DETAILED DESCRIPTION OF THE INVENTION

Figure 1:
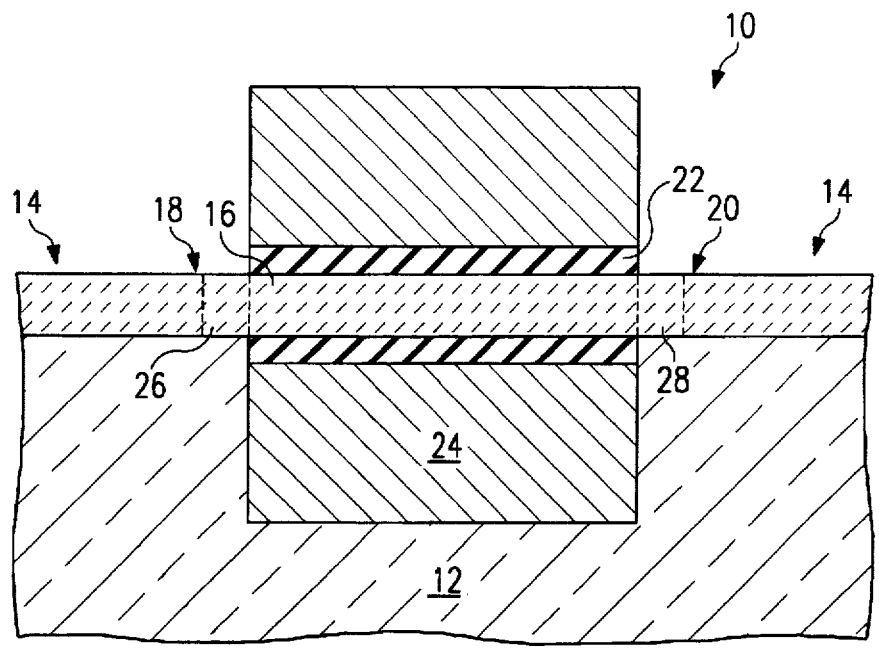
FIG. 1 is a cross-sectional view of a semiconductor structure in accordance with the present invention.

FIG. 1 is a cross-sectional view of a semiconductor device 10 according to the present invention. Device 10, which is an FET, includes an insulating support 12 and a strip of semiconductor material 14. In one aspect of the invention, insulating support 12 is formed from a dielectric such as $SiO_2$ or glass over a semiconductor substrate, and strip 14 is formed from polysilicon to form a TFT. Strip 14 includes a channel 16 and source and drain regions 18 and 20. A gate insulator 22 encircles channel 16, and a gate electrode 24 encircles gate insulator 22. Because gate electrode 24 completely encircles channel 16, the on current and transconductance of device 10 is increased approximately 2–5 times greater than the on current and transconductance of a device having a gate electrode along only a top portion of the channel 16 surface. Additionally, device 10 may include lightly doped source and drain regions 26 and 28, which lower the electric field at drain 20 to reduce the tendency of electrons from drain 20 to become lodged in gate insulator 22. Such lodging, commonly referred to as the "hot electron" problem, may over time shift the threshold voltage of device 10. Furthermore, as discussed below, gate electrode 24 is self-aligned to channel 16. Such self-alignment significantly reduces the size of the device and also reduces parasitic capacitances such as the Miller capacitance, and therefore increases the switching speed of device 10.

Figure 2:
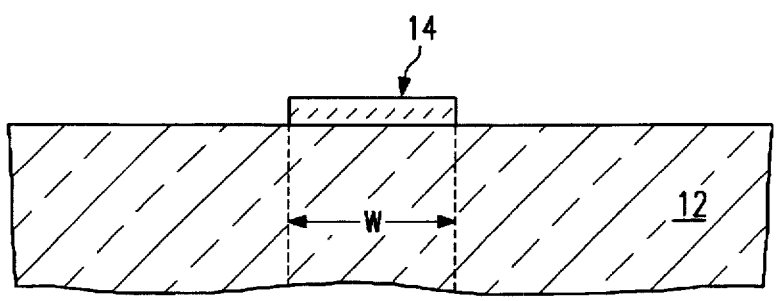
FIG. 2 is a cross-sectional view of a strip of semiconductor material formed on the insulating support.

FIGS. 2–10 illustrate a method for forming device 10. Referring to FIG. 2, strip 14 of semiconductor material, having a width W, is formed on an insulating support 12. In one aspect of the invention, the strip 14 is a layer of amorphous silicon deposited on insulating support 12, which is an $SiO_2$ layer over a silicon substrate, with a low pressure chemical vapor deposition (LPCVD) process. The thickness of the amorphous silicon film is in the range of approximately 500–2500 Å. Typically, the thinner the film, the lower the threshold voltage of the TFT. The deposition temperature is preferably kept between 475–650° C. so that few nuclei are present for the subsequent grain growth process. The amorphous silicon may be deposited using a source gas of either $SiH_4$, which is the conventional gas used, or $Si_2H_6$. $Si_2H_6$ allows the LPCVD to be performed at approximately 475° C. and still produce a film that is acceptable. For some devices, such as liquid crystal displays (LCDs), the insulating support 12 may be glass or quartz. An LPCVD process at such a low temperature (approximately 475° C.) allows insulating support 12 to be glass or quartz.

Alternatively, the silicon film 14 may be formed as polysilicon. Typical polysilicon formation temperatures range from 650–950° C. for forming polysilicon on an $SiO_2$ layer over a silicon substrate. In one embodiment, this polysilicon film may then be made amorphous by ion implantation of silicon. Typically, an implantation level of about $5\times10^{15}$ atoms/cm$^2$ at about 75 KEV is sufficient, although the level may vary depending upon the thickness of the deposited film. The growth conditions, and subsequent implant, if necessary, should be such that the deposited film is made as amorphous as possible. Alternatively, the strip 14 may remain polycrystalline silicon and the inventive device formed from polycrystalline silicon as the channel, source and drain regions 16, 18, and 20.

Next, the amorphous silicon film 14 is exposed to a relatively long, low temperature anneal in $N_2$ or AR to convert the amorphous silicon to large grained polysilicon. Specifically, this anneal is performed at temperatures approximately in the range of 475–600° C. and for a time period approximately in the range of 20–100 hours. However, the temperature during the annealing process is low enough to prohibit the generation of additional nucleation sites or small crystals, but high enough to allow existing crystallites to grow through solid-state diffusion. Such an annealing process produces a polysilicon film having grain sizes of approximately 5 μm and larger. Alternatively, the amorphous silicon film may be converted to large grain polysilicon by using existing laser recrystallization methods.

The amorphous silicon film is converted into large-grained polysilicon because larger grains produce improved TFTs. For example, the larger grains typically reduce the number of charges that may be stored at carrier traps located mainly at the grain boundaries. Conversely, small grains often generate many such traps, which often force a significant portion of the gate voltage applied to the TFT to be wasted in the work of charging and discharging these trap sites instead of creating an inversion layer, i.e., forming the channel, to turn the TFT on. To further reduce the charge density at the grain boundaries, the polysilicon layer may be passivated with hydrogen (H). Such passivation reduces the threshold voltage and sub threshold leakage currents of the TFT. There are many known ways in which the polysilicon layer may be hydrogen passivated, including a long bake in an appropriate forming gas or H, applying plasma-enhanced chemical vapor deposition (PECVD) silicon nitride layers, immersing the semiconductor structure 10 in a hydrogen plasma at approximately 300° C., or by high-dose ion implantation with protons.

Alternatively, acceptably large grained polycrystalline silicon may be formed for strip 14 using any suitable technique, including the direct formation of polysilicon on a glass or $SiO_2$ layer.

Once the polysilicon layer 14 has been formed on insulating support 12, one or more polysilicon strips 14 are formed using existing photolithography methods. In one aspect of the invention, width W is 2λ, where 2λ is the minimum feature-size capability for the width of the polysilicon layer 14 for the process technology being used.

Figure 3:
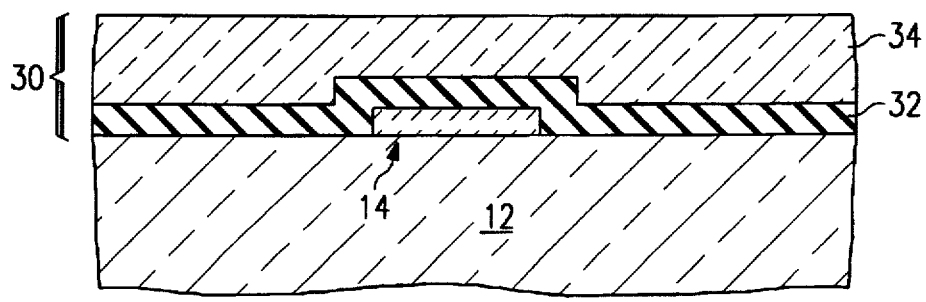
FIG. 3 is a cross-sectional view of the structure of FIG. 2 with the addition of a planar layer.

Referring to FIG. 3, after the formation of polysilicon strip 14, a planar layer 30 is formed over insulating support 12 and strip 14. In one aspect of the invention, layer 30 includes a layer 32 of silicon dioxide ($SiO_2$) that is approximately 2,000 Å thick, and a layer 34 of phosphorous glass or boron doped glass that is approximately 5,000 Å thick. Layer 34 is then flowed to give a planar surface 36. In one aspect of the invention, $SiO_2$ layer 32 is deposited using either a conformal chemical vapor deposition or a low pressure chemical vapor deposition. Next, layer 34 is flowed at an appropriate temperature, typically in the range of 800–1100° C. for some applications, though lower temperatures may be used if desired to give approximately flat upper surface 36. Alternatively, layer 30 having planar surface 36 may be formed from a spin-on glass film using existing techniques. This is useful for LCDs formed on glass or quartz.

Figure 4:
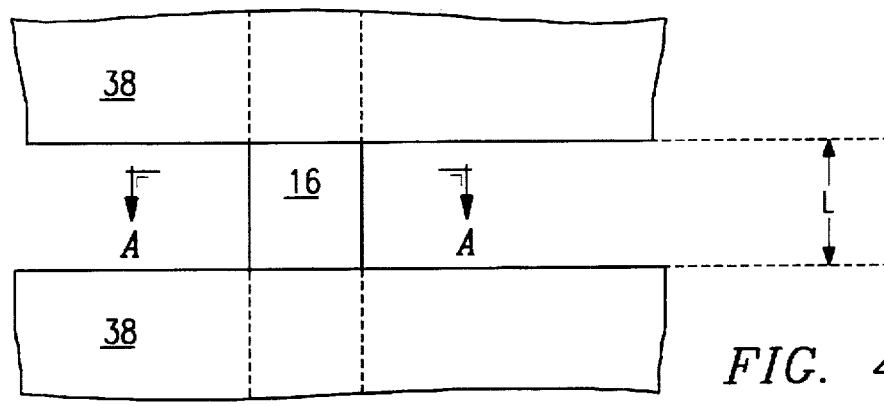
FIG. 4 is a top view of the structure of FIG. 3 with the addition of a mask layer.
Figure 5:
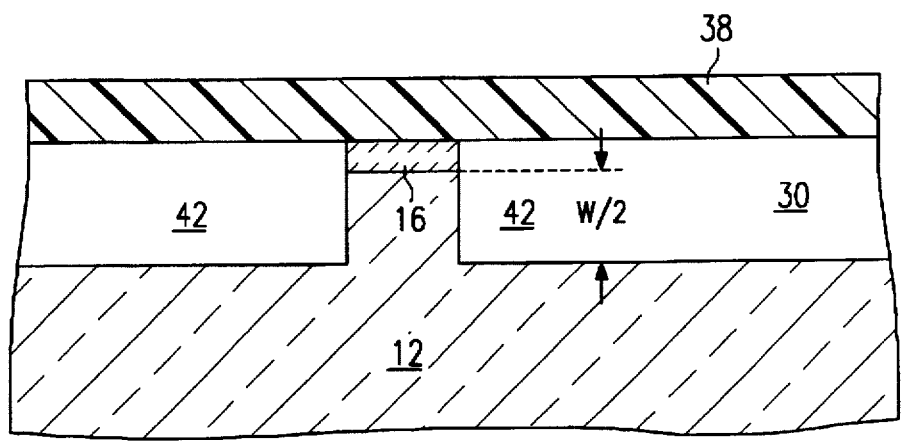
FIG. 5 is a cross-sectional view taken along lines A—A of the structure of FIG. 4 after it has been anisotropically etched.

Referring to FIG. 4, which is a top view of the structure of FIG. 3, a photoresist mask 38 is formed on surface 36 and etched to expose midsection 16, which has a length L. In one embodiment of the invention, length L is approximately equal to width W. The exposed portions of layer 30 and insulating support 12 are anisotropically etched to give a structure having the view shown in FIG. 5 taken along lines A—A of FIG. 4. An anisotropic etch process having a high $SiO_2$ to Si selectivity is preferred. Such an anisotropic etch may be performed using existing ion-assisted plasma etch processes that use various fluorocarbon plasma chemistries. As shown in FIG. 5, the anisotropic etch completely removes the exposed portion of layer 30 and etches into insulating support 12 a depth of approximately λ, which is about W/2, below the bottom of the midsection 16. Thus, this anisotropic etch forms on either side of strip 14, at the midsection 16, open regions 42.

Figure 6:
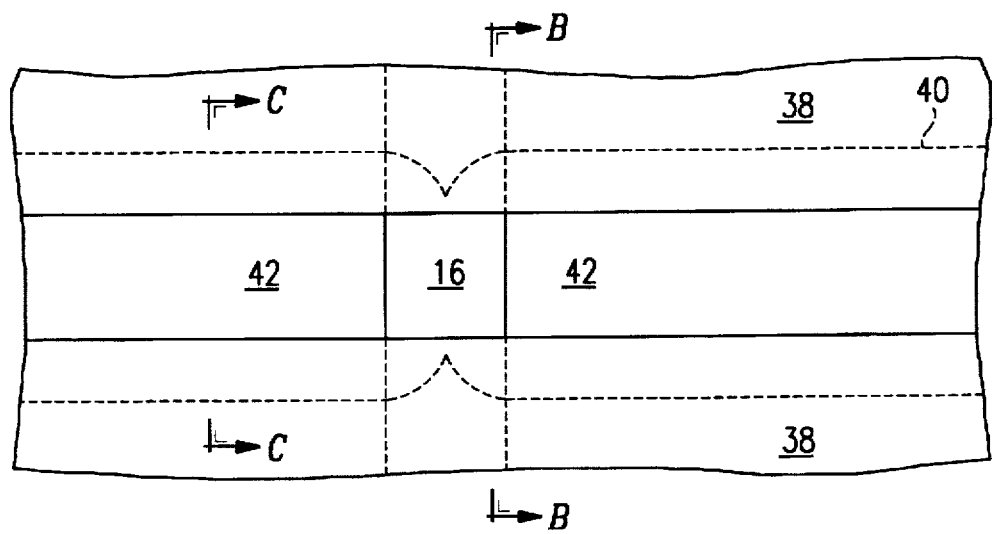
FIG. 6 is a top view of the structure of FIG. 5 after it has been isotropically etched.

Referring to FIG. 6, the exposed portions of insulating support 12 and layer 30 are then isotropically etched to give an undercut whose boundary is shown by dotted line 40. The amount of undercut within regions 42 is such that an intermediate cavity 46 (FIG. 7), which is beneath midsection 16, is formed because the insulating layer 12 is etched through under the midsection 16. Such an isotropic etch may be 10 performed using an aqueous solution of HF, such as buffered oxide etch (BOE), to a desired depth. In one embodiment, a depth approximately W/2 beyond the original depth of openings 42 after the anisotropic etch is appropriate. However, a smaller undercut is desired in some designs and, for a large gate electrode, a larger undercut is desired, as much as 2λ or greater.

Figure 7:
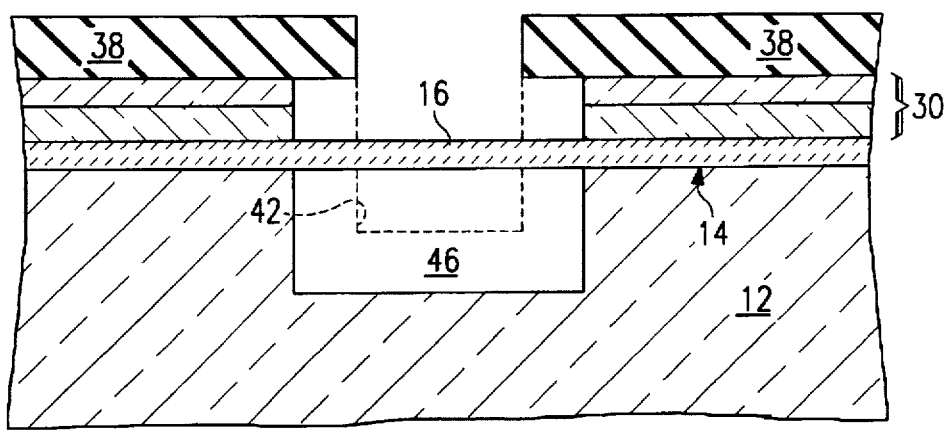
FIG. 7 is a cross-sectional view of the structure of FIG. 6 taken along lines B—B of FIG. 3.

Referring to FIG. 7, which is a cross-sectional view taken along lines B–B of FIG. 6, one can see that cavity 46 is formed beneath midsection 16 of strip 14.

The dotted line shows the depth of openings 42 and the solid line the cavity 46 after the isotropic etch.

Figure 8:
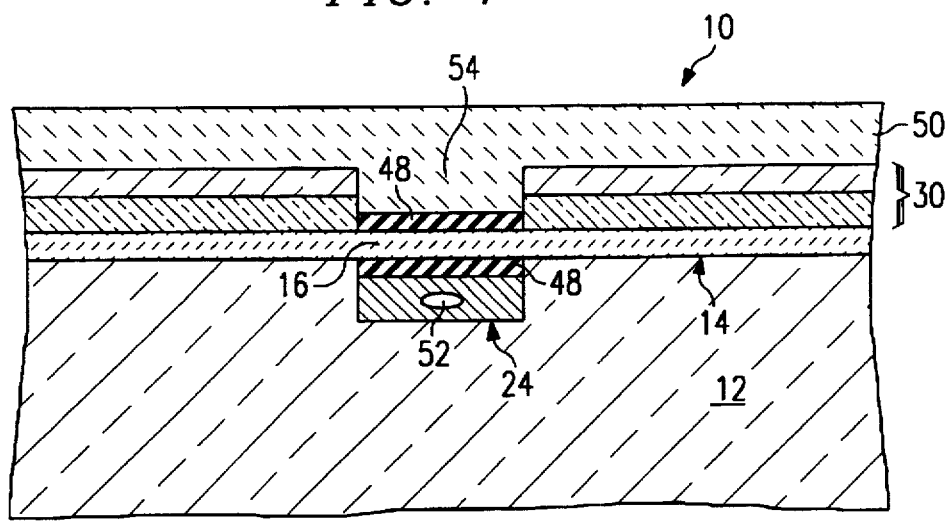
FIG. 8 is a cross-sectional view of the structure of FIG. 7 after removal of the mask layer and the addition of a gate oxide and an electrically conductive layer.

Referring to FIG. 8, a gate insulator or dielectric 48 is formed such that it completely encircles midsection 16 of strip 14. Because the length of midsection 16 is defined by the width of cavity 46, the gate electrode will be self-aligned with midsection 16, which will become the channel region of the TFT. Such self-alignment will reduce the Miller parasitic capacitance, which can be increased if the gate electrode overlaps the source or drain regions 18 and 20 (FIG. 1). The thickness of gate insulator 48 may vary within the range of approximately 150–500 Å, depending upon the desired threshold voltage. Gate insulator 48 may be formed using a combination of thermal oxidation followed by conformal CVD of tetra-ethyl-ortho-silicate (TEOS)-based silicon dioxide. Alternatively, gate insulator 48 may be grown thermally in dry oxygen ($O_2$). Or, gate insulator 48 may be formed using only CVD as is used to form existing TFTs, or using a chemical-vapor deposited silicon-nitride-gate dielectric process. In one aspect of the invention, before gate insulator 48 is formed, the exposed midsection 16 can be thinned by light oxidation and a BOE etching if desired to form a specific-size device.

Next, midsection 16 is implanted with a suitable dopant to form the channel of the TFT. For example, to form an N-channel transistor, midsection 16 may be implanted with boron in the range of approximately $10^{12}$ atoms/cm$^2$. Alternatively, to form a P-channel device, channel region 16 may be left undoped, though typically the channel 16 is lightly implanted with arsenic (As), to have the desired threshold characteristics selected by the designer using known design tools. Mask layer 38 is removed either before or after midsection 16 is implanted to form the channel 16.

Still referring to FIG. 8, structure 10 is then coated with a layer 50 of polysilicon. As shown, layer 50 completely fills in openings 42 and cavity 46 to completely encircle both gate oxide 48 and channel 16. Depending upon the deposition process used, some voids 52 may exist in the portion of polysilicon layer 50 in the cavity 46 beneath channel 16. However, it is believed that such voids have no adverse effect on the performance of the resulting TFT, and may be avoided altogether in some polysilicon deposition techniques.

After it has been deposited, polysilicon layer 50 is doped and etched to the surface of glass layer 30. In one aspect of the invention, polysilicon layer 50 is first doped with an N+ implant or diffusion. The top portion of layer 50 may be removed with existing processes, such as chemical mechanical polishing (CMP), or if photoresist mask 38 has small enough openings, an anisotropic plasma etch may be used to remove the poly layer 50. The plasma chemistry should have a high selectivity of Si to $SiO_2$ such as that found in $SF_6$-based ion-assisted plasma etching. Alternatively, the top portion of layer 50 may be etched first, and the portion of layer 50 remaining in cavity 46 and openings 42, i.e., the portion of layer 50 that forms gate electrode 24, may be doped afterwards. Depending upon the doping process used, the upper portion 54 of gate electrode 24 may be more highly doped than the lower portion.

Figure 9:
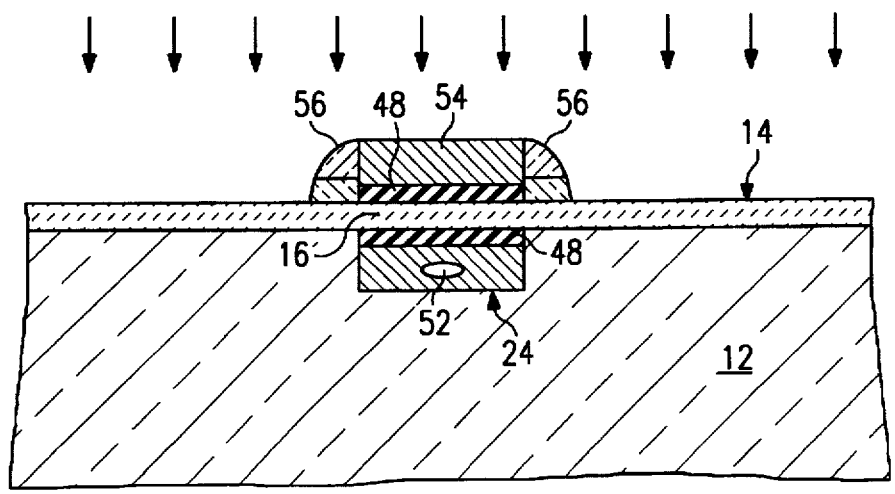
FIG. 9 is a cross-sectional view of the structure of FIG. 8 following etching and during a first self-aligned impurity implantation process.

Referring to FIG. 9, at this point in the process, layer 30 may be removed, and the end portions of strip 14 adjacent to channel 16 may be suitably doped to form source and drain regions 18 and 20 (FIG. 1) of the TFT. The doping of the source and drain regions 18 and 20 also implants dopant into the top and exposed sidewall portions of the gate electrode 24. A later diffusing step will drive the dopant under the channel 16, into lower portions 54 to ensure that it is doped, if it has not already been doped in a previous step. The source and drain regions 18 and 20 are thus also formed as self-aligned with the gate electrode 24.

The layer 30 is etched back using an appropriate masking scheme to form spacers 56. In one aspect of the invention, the width S of spacers 56 is approximately 0.5 µm. As is known in the prior art, where S equals approximately 0.15 µm, the on/off current ratio for the resulting TFT is approximately $10^4$ as compared to $10^2$ for non-LDD devices. Furthermore, the on/off current ratio where S equals approximately 0.45 µm is approximately $10^7$. Following the formation of spacers 56, strip 14 is implanted with a dopant. For example, in one aspect of the invention, layer 14 is doped with As using an implant level of approximately $10^{15}$ atom/cm$^2$ to form N+ source and drain regions 18 and 20, which in FIG. 9 would begin at the outer edges of spacers 56.

Figure 10:
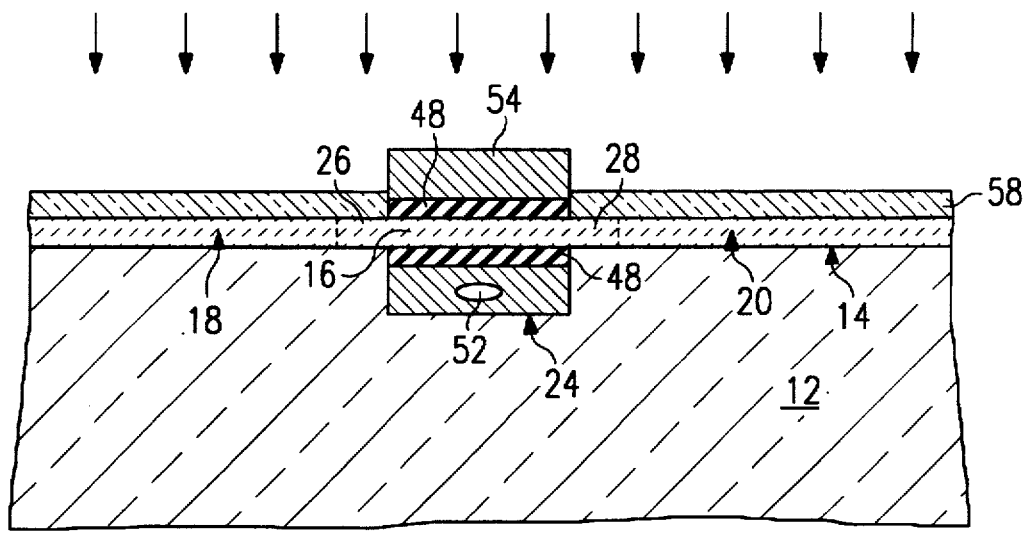
FIG. 10 is a view of the structure of FIG. 9 during a second self-aligned impurity implantation process.

Referring to FIG. 10, spacers 56 may then be removed such as with a BOE or plasma etching. Next, a light dose of dopant is implanted to form lightly-doped regions 26 and 28 of an LDD-type structure. The LDD structure is thus self-aligned with the gate electrode and channel region using side wall oxide spacers, providing significant size and device operation features not previously possible in polysilicon devices formed over an insulating substrate. For example, to produce regions 26 and 28 of an N– material, a light dose of a value appropriate for LDD devices of as is implanted through an applied oxide layer 58. The structure 10 may then be lightly oxidized to heal any edge voids in the gate dielectric 48. The dopants may then be activated by using rapid thermal annealing (RTA) to reduce lateral diffusion.

In an alternative embodiment of the invention, after the glass layer 30 is removed, and an implant oxide is formed over strip 14 and gate electrode 24, a light dopant implant may be performed to form drain regions 18 and 20 from a lightly doped material. Next, spacers 56 are formed and a second implant is performed such that regions 26 and 28 beneath spacer 16 remain lightly doped and the remaining portions of source and drain 18 and 20 become highly doped to give a resulting TFT with lightly doped drain and source regions 26 and 28.

Figure 11:
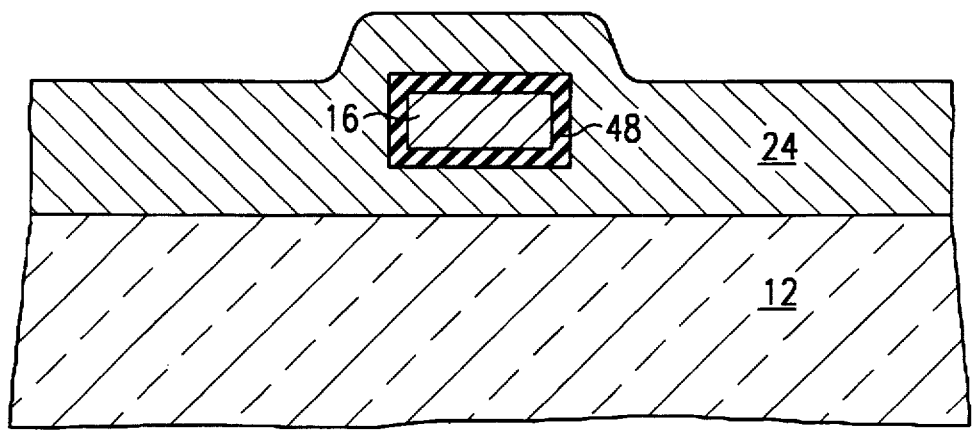
FIG. 11 is a cross-sectional view of the structure of FIG. 10 taken along lines B—B of FIG. 3.

FIG. 11 shows a cross-sectional view of the completed TFT as viewed along lines AA of FIG. 4. As will be appreciated, the appropriate electrical interconnections to the source and drain regions 18 and 20 are made using vias, contacts, or the like so that the polysilicon transistor 10 can become an element of a larger circuit. The contacts can be from a lower layer to a device 10 or from a higher layer. Most likely, the electrical interconnections will contact source/drain regions 18 and 20 to respective conductors in the circuit, and the gate electrode 24 to another conductor to provide transistor operations, diode connections, load connections, or the like, as required for each circuit design. The standard techniques known in the art today for forming electrical contacts to poly one, poly two, and other layers, may be used.

It will be appreciated that, although a specific embodiment of the invention has been described herein for purposes of illustration, various modifications may be made without departing from the spirit and scope of the invention. Accordingly, the invention is not limited except as by the appended claims.

I claim:

1. A semiconductor device, comprising:
   an insulating support having a cavity disposed therein;
   a strip of semiconductor material having two end regions contacting said insulating support and having a midsection that bridges said cavity;
   a layer of dielectric material wrapped around said midsection; and
   a layer of conductive material wrapped around said dielectric layer, a first portion of said conductive layer disposed within said cavity, a second portion of said conductive layer disposed outside of said cavity, said first portion being self-aligned with said second portion.

2. The device of claim 1 wherein said insulating support comprises a dielectric material.

3. The device of claim 1 wherein said semiconductor material comprises polysilicon.

4. The device of claim 1 wherein a first of said end regions comprises a drain region, a second of said end regions comprises a source region, and said midsection comprises a channel region.

5. The device of claim 1 wherein said conductive layer forms a gate electrode.

6. The device of claim 1 wherein said midsection is substantially planar with respect to said end regions and said insulating support.

7. The device of claim 1 wherein said dielectric layer forms a gate insulator.

8. A semiconductor device, comprising:
   a body of semiconductor material having a source region, a drain region, and a channel region;
   a gate insulator disposed around said channel region;
   a gate electrode disposed around said gate insulator; and
   said source and drain regions being self-aligned to all portions of said gate electrode.

9. The device of claim 8 wherein said source region and said drain region each comprise a lightly doped region adjacent to said channel region.

10. The device of claim 8 wherein said gate insulator comprises silicon dioxide.

11. The device of claim 8 wherein said gate electrode comprises polysilicon.

12. The device of claim 8 wherein said semiconductor material comprises polysilicon.

13. A semiconductor device, comprising:
   a dielectric substrate that defines a trench;
   first and second doped semiconductor regions positioned on said substrate and on opposite sides of said trench;
   a third doped semiconductor region positioned between said first and second regions and bridging said trench, said third region having a lower doping concentration than said first and second regions;
   an insulator positioned about said third region; and
   a layer of conductive material positioned about said insulator, said conductive layer having a first section positioned inside of said trench and having a second section positioned outside of said trench and self-aligned to said first section.

14. The device of claim 13 wherein said first and second regions are of a first conductivity type and wherein said third region is of a second conductivity type.

15. The device of claim 13 wherein said first and second regions include lightly doped regions that are adjacent to said third region.

16. The device of claim 1 wherein said conductive layer is wrapped all the way around said midsection.

17. The device of claim 8 wherein said gate electrode is disposed completely around said channel region.

18. The device of claim 13 wherein said conductive layer is positioned fully about said third region.

* * * * *